(12) United States Patent
DeMulder et al.

(10) Patent No.: US 7,737,003 B2
(45) Date of Patent: Jun. 15, 2010

(54) METHOD AND STRUCTURE FOR OPTIMIZING YIELD OF 3-D CHIP MANUFACTURE

(75) Inventors: Edward M. DeMulder, Essex Junction, VT (US); Sarah H. Knickerbocker, Hopewell Junction, NY (US); Michael J. Shapiro, Austin, TX (US); Albert M. Young, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 777 days.

(21) Appl. No.: 11/163,226

(22) Filed: Oct. 11, 2005

(65) Prior Publication Data

US 2007/0080448 A1     Apr. 12, 2007

(51) Int. Cl.
    *H01L 21/00*     (2006.01)
(52) U.S. Cl. .................. 438/464; 438/460; 438/113; 438/107; 438/15; 257/E21.599
(58) Field of Classification Search .............. 257/E21.6, 257/E21.599; 438/106, 113, 118, 455, 458, 438/459, 460, 464, 15
    See application file for complete search history.

(56) References Cited

U.S. PATENT DOCUMENTS

| | | | |
|---|---|---|---|
| 5,834,162 A | 11/1998 | Malba | |
| 5,909,559 A | 6/1999 | So | |
| 5,927,993 A * | 7/1999 | Lesk et al. | ................... 438/455 |
| 6,105,119 A | 8/2000 | Kerr et al. | |
| 6,130,674 A | 10/2000 | Vaswani et al. | |
| 6,179,489 B1 | 1/2001 | So et al. | |
| 6,593,624 B2 | 7/2003 | Walker | |
| 6,645,832 B2 | 11/2003 | Kim et al. | |
| 6,661,085 B2 | 12/2003 | Kellar et al. | |
| 6,724,084 B1 * | 4/2004 | Hikita et al. | ................. 257/737 |
| 6,737,675 B2 | 5/2004 | Patel et al. | |
| 6,762,076 B2 | 7/2004 | Kim et al. | |
| 6,841,813 B2 | 1/2005 | Walker et al. | |
| 6,881,994 B2 | 4/2005 | Lee et al. | |
| 6,887,769 B2 | 5/2005 | Kellar et al. | |
| 6,888,750 B2 | 5/2005 | Walker et al. | |
| 2006/0035443 A1 * | 2/2006 | Hsu et al. | .................... 438/464 |
| 2007/0023121 A1 * | 2/2007 | Jones et al. | .................... 156/64 |

\* cited by examiner

*Primary Examiner*—Matthew C Landau
*Assistant Examiner*—Candice Y Chan
(74) *Attorney, Agent, or Firm*—Whitham, Curtis, Christofferson & Cook, P.C.; Joseph P. Abate (57) ABSTRACT

The process begins with separate device wafers having complimentary chips. Thin metal capture pads, having a preferred thickness of about 10 microns so that substantial pressure may be applied during processing without damaging capture pads, are deposited on both device wafers, which are then tested and mapped for good chip sites. A handle wafer is attached to one device wafer, which can then be thinned to improve via etching and filling. Capture pads are removed and replaced after thinning. The device wafer with handle wafer is diced, and good chips with attached portions of the diced handle wafer are positioned and bonded to the good chip sites of the other device wafer, and the handle wafer portions are removed. The device wafer having known good 3-D chips then undergoes final processing.

18 Claims, 9 Drawing Sheets

METHOD AND STRUCTURE FOR OPTIMIZING YIELD OF 3-D CHIP MANUFACTURE

BACKGROUND OF THE INVENTION

1. Field of the Invention

The present invention generally relates to a three-dimensional (3-D) chip integration process and structure, and, more specifically, relates to a method for optimizing the yield of a three-dimensional chip integration process and 3-D chips upon completion of the integration process.

2. Description of the Related Art

This invention relates to 3-D semiconductor devices built with potentially different technologies fabricated on separate wafers, diced, and then connected together by mounting one of the dies on the other. These devices, referred to as 3-D integrated circuits (ICs), have the potential for enabling circuit performance enhancements required to meet the aggressive performance targets of future technology. These circuits contain multiple layers of active devices with vertical interconnections between the layers. In a 3-D IC, each transistor can theoretically access a greater number of nearest neighbors than a conventional two-dimensional (2-D) circuit, such that each transistor or functional block will have a higher bandwidth and thus, in the aggregate, can operate properly at higher clock cycle rates.

Three-dimensional electronics offer significant performance benefits over 2-D ICs based on the electrical and mechanical properties arising from the new geometrical arrangement provided thereby in comparison with single, planar (2-D) chips. The advantages of very high integration density on a single chip in regard to circuit performance and manufacturing economy have been recognized for some years. Increased chip functionality can be obtained at a lower manufacturing cost by forming more devices (e.g. transistors, storage cells and the like) on a single wafer. For these reasons, there is a trend toward producing larger chips and the packaging of many chips in the same package. However, while functionality and manufacturing economics may increase from increased integration density, there is a limit to performance gain with single chips and multi-chip packages due to signal propagation increases with increased connection length. Some of these limitations may be overcome with 3-D geometries but may also suffer limitations due to interchip connections in known chip stacking technologies. Additional projected advantages of 3-D semiconductor devices include, but are not limited to: increased packing density of chips, reduced wire delay, higher fan-out, reduced noise, lower power, and enhanced circuit functionality.

Known chip stacking technologies and their problems include 1) connection density versus yield, and 2) number of connections between chips, especially using edge bonding. A good example is the merging of DRAM and logic in certain packaging operations, which has been trending towards connecting one chip directly to the face of another chip through controlled collapse chip connection (C4) solder connections. Another example is the so-called "mother/daughter" chip structure, which has been used to provide a large number of inputs/outputs (I/Os) between two chips, although it can create limitations on the available area to make connections to the outside package.

Additionally, the rapid growth of devices such as cellular phones, digital cameras, and other mobile data terminals has placed a strong demand on downsizing and densification in consideration of both the thickness and also the area of a semiconductor device. Downsizing and densification of a semiconductor device by thinning, if performed without increasing the area of the chip, would provide many desirable effects, such as increased flexibility, allowing smaller chip packages or multiple chips in the same package, and improved chip performance due to increased heat dissipation. Thinned chips can function at higher speeds and consequently increased heat dissipation, since the insulating silicon between the device and thermal management material is reduced.

Currently, there is considerable interest in creating "system-on-a-chip" solutions for different applications. Ideally, such a computing processing system is fabricated with all the necessary IC devices on a single chip. In practice, however, it is very difficult to implement a truly high-performance system because of different fabrication processes and lower manufacturing yields for the logic and memory circuits, and different preferred technologies for respective functional sections such as processors, gate arrays, memories, distributed power regulators, connectors and the like. For example, integrating functions onto a single chip generally require compromise of the performance of the logic and the performance/density of the memory. Further, the chips often become very large, and the yield of fully functional chips decreases. The use of three-dimensional integrated circuitry allows for the logic and memory to be built separately, with processes optimized for each, and then combined into a single chip stack. If the memory and logic chips are built separately, with smaller die sizes, the yields can, in theory, be greatly enhanced. Then, the separate, smaller chips can be integrated into a single module, or chip stack. Such a chip could include, for example, logic functions, and dynamic random access memory (DRAM) functions.

One problem associated with the background art, however, involves the general trend of device yield decreasing as device complexity, integration density, or chip size, increases. It has been observed that as chip area increases, the effective chip yields are reduced at nearly a linear rate. This trend can be attributed to the fact that for the same quality of semiconductor, any defect existing in a larger chip results in an overall greater area waste than is the case with smaller chip wafers. Similarly, any finite likelihood of a defect in a given element (e.g., transistor, connection, or the like), however slight, is greatly multiplied in high integration density chips and may become quite significant with increased chip area. Thus as chip size increases, the cost of manufacturing due to yield degradation becomes excessive.

One background art method of forming stacked semiconductor packages involves dipping leads of separate yet stacked chips into a soldering solution. The major disadvantage of this method is the difficulty in controlling the amount of soldering solution that contacts the stacked chips. Additionally, densely packed leads often results in short-circuiting. Another background art method involves applying a tape-automated bonding process. Bonding tape is attached to the sides of paired semiconductor chips in such a way that conductive interconnections formed on one side of the bonding tape connect the corresponding chip pads of adjacent pairs of chips. The die and circuitry on the leadframe, except for outer portions of the leadframe, are encapsulated in a mold forming a single package body for the entire semiconductor package. The disadvantage to this approach is that any need for repair of the module after package fabrication would cause the entire module to be rejected.

Semiconductor chips are typically fabricated on a single substrate such as a wafer or a panel, using wafer-level fabrication processes. One step that is often performed at the wafer level is the fabrication of contacts on the components. For example, solder bumps can be fabricated on a chip using a deposition process, permitting controlled collapse chip connections (C4) to be made for packaging. In another example, solder balls can be fabricated on semiconductor packages by bonding pre-formed balls using solder reflow performed with a furnace or a laser. Often the solder balls are arranged in a ball grid array (BGA), or a fine ball grid array (FBGA), and function as the terminal contacts for the packages. One shortcoming of these conventional contact fabrication processes is that time and materials are wasted in forming the contacts on defective and substandard components. Additionally, pressure joining processes tend to crush or compress C4s, resulting in shorting of C4 interconnects. Thus, because of the height of these connections relative to the chip, and the ease at which these connections can be damaged, another limitation is that pressure and mechanical strain must be limited while integrating chips containing these types of connections. Also, C4s will melt at high temperatures, which restrains subsequent processing conditions and operating conditions.

Further, current art teaches the thinning of chips in order to decrease the aspect ratio of vias drilled into the chip. When a via is drilled through a majority of the wafer thickness of a chip, the aspect ratio is very large, often 100:1 or more, particularly at known and foreseeable minimum feature sizes, making it difficult to fill the via with a seed metal and subsequently deposited metal to reliably and repeatably provide vertical connection between stacked up interconnect metal lines. Thinning the chip decreases the aspect ratio of the via, thereby reducing the difficulty of filling the via. However, thinned chips lack structural integrity and become difficult to handle for further processing. The prior art teaches the use of a second wafer known as a handle wafer. Under the prior art, a device wafer can be thinned by first attaching a handle wafer to one side of the device wafer, then shaving, etching, polishing, or grinding the opposite side of the device wafer. The thinned wafer is then aligned with a second wafer of normal thickness and complimentary pre-diced chips are bonded together to form a 3-D structure. Under the current art, the handle wafer is removed before dicing the 3-D structure. This implies that all chips of one wafer are bonded to corresponding chips on another wafer regardless of defects in individual chips on either wafer.

In this regard, an additional drawback experienced in the background art of forming stacked chips is the possibility of bonding a good chip site of one wafer to a bad chip site on another wafer. Bonding a defective chip to a good chip, at best, causes waste of the good chip. Such bonding may further compromise the yield because a thinned chip cannot generally be released from a chip to which it is bonded without sustaining irreparable damage. The process of forming effective chip stacks yields functional devices only if both sites are working correctly, and there is currently no method to increase the frequency of bonding good chip sites to good chip sites, thereby increasing the yield of good, functional chip stacks. Further, current methods of testing semiconductor devices for functional chips require subjecting each chip to the testing method, resulting in increased fabrication cost and time.

SUMMARY OF THE INVENTION

It is an object of this invention to provide a new and improved three-dimensional chip integration process.

It is another object of the present invention to maximize the frequency of good-die-to-good-die bonding in a 3-D chip integration process consistent with chip thinning.

The method of the present invention involves several steps, beginning with forming at least two complementary chips on separate device wafers. These chips are designed complementarily such that they can be interconnected by stacking to form a chip stack. If a chip stack is comprised of two separate chips of types A and B, then all chips of type A are formed on device wafers of type X, and all chips of type B are formed on device wafers of type Y. Instead of typical C4 or solder bump metallurgy, thin metal capture pads are deposited on both wafers. These pads can be made of Cu, Au, Al, or Sn. The preferred metal is Sn, due to its low cost, resistance to oxidation and ease of plating. Additionally, Sn is preferred for the pads that are tested and then removed, whereas Cu is preferred for the pads that are bonded together. In the preferred embodiment, pads that will be used for testing and subsequently removed are made of Sn, and pads that will be bonded together are made of Cu. For reasons discussed below, the thickness of the final capture pads is preferably about 10 microns. Both wafers are then tested to determine and map the good chip sites.

After mapping good chip sites, one device wafer is subjected to a thinning process. In the previous example, if a chip of type A is to be thinned, then device wafers of type X are subjected to the thinning process. Thinning the device wafer consists of attaching a handle wafer to the top side of the device wafer. The bottom side of the device wafer is then ground, polished, etched or the like until the wafer is approximately 50 microns thick. Vias are then etched into the device wafer and filled with metal to provide vertical connection between metal interconnect lines on respective stacked chips. Thinning the chip results in a large decrease in aspect ratio of the vias, thereby reducing the difficulty of reliably filling vias with metal.

Next, the one of the device wafers, and handle wafers if any chips have undergone the thinning process, are diced and good dies retained according to the good die site map. In the previous example, only device wafers of type X are diced at this step, and functioning chips of type A are retained. The retained dies are positioned and bonded to the good sites on the non-diced device wafer of type Y. One advantage to using thin metal capture pads is that due to the small thickness of approximately 10 microns, substantial pressure can be applied to the chips during testing, positioning, and bonding. On the other hand, if more common 100 micron C4s had been used, the metal would suffer from compression damage and the chips would experience shorting at C4 interconnects. Also, C4s will melt at high temperatures. If device wafers of type X were subjected to the thinning process, then the portions of the handle wafer bonded thereto are now removed from chips of type A. The resulting device wafers of type Y, having thinned chips of type A stacked onto chips of type B are diced and good chip stacks are separated and BEOL processing is performed; during which the stacked chips may generally be treated in the same manner as planar 2-D chips.

BRIEF DESCRIPTION OF THE DRAWINGS

The accompanying drawings, which are incorporated into and form a part of the disclosure illustrate an embodiment of the invention and, together with the description, serve to explain the principles of the invention.

DETAILED DESCRIPTION OF PREFERRED EMBODIMENTS OF THE INVENTION

Figure 1:
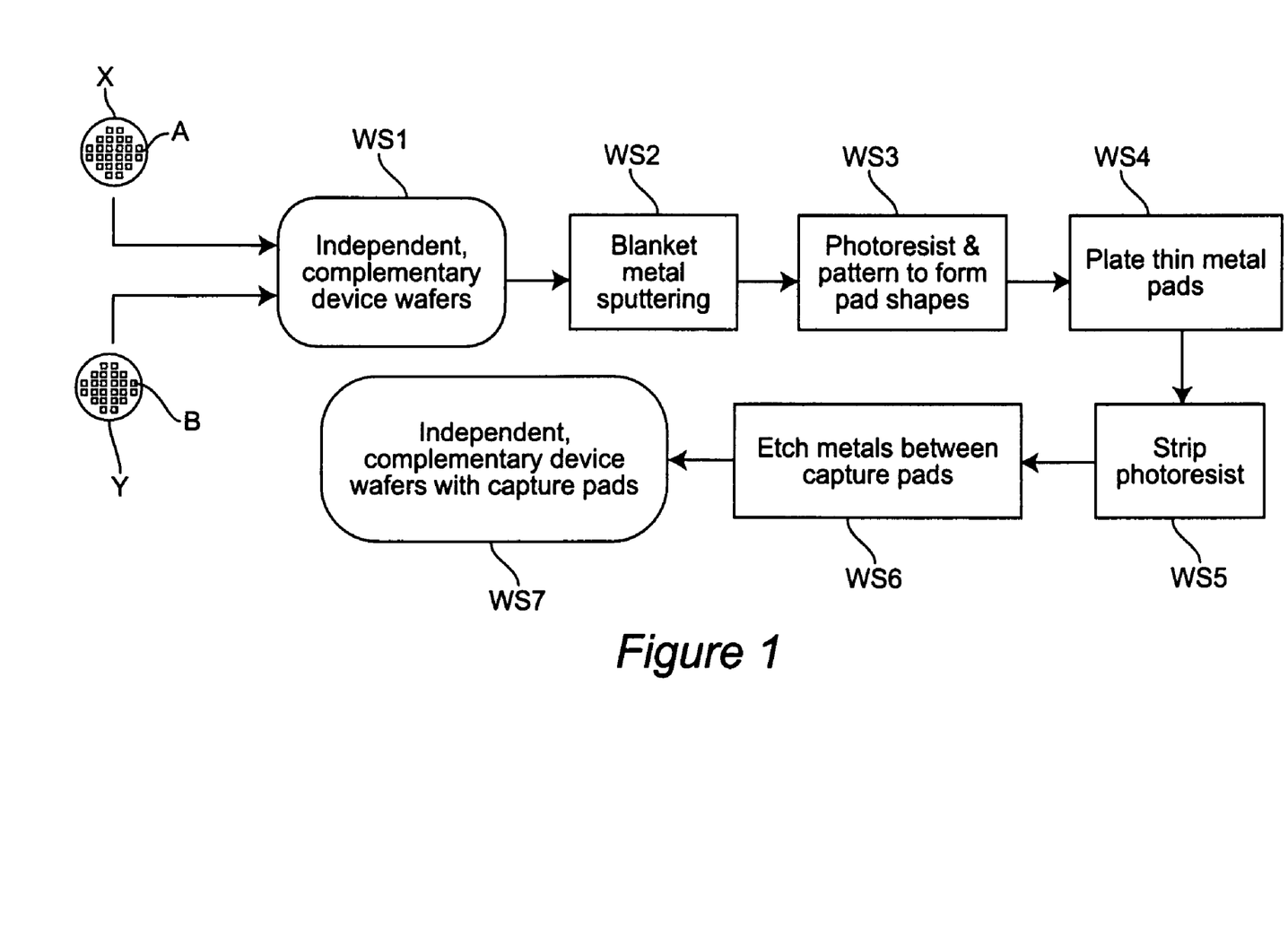
FIG. 1 is a process flow diagram showing one portion of the fabrication process of the present invention.

FIGS. 1 through 4c illustrate a fabrication process for a 3-D integrated chip according to a preferred embodiment of the invention. Referring to FIG. 1, the fabrication process begins with the process of forming capture pads on at least two independent device wafers X and Y already having a plurality of chips types A and B respectively formed thereon in step WS1. Chips A and B are designed such that they are complementary to one another in layout so that they may be interconnected by a 3-D integration process to form a chip stack. Blanket metals are applied to the top side of the wafers by a sputtering process in step WS2. The blanket metal layer improves the adhesion of the pads, and may consist of Cr, Cu, Ni, Ta, and various combinations of Ti, and may be in plural layers at various thicknesses. Preferably, the blanket metal layer is TiW (10/90) at 1650 Å, CrCu (50/50) at 1800 Å, and Cu at 4300 Å. Photoresist is applied to the surface and patterned in accordance with desired pad shapes in step WS3. The pads can be of any shape, dependent upon the topology of the chip. Thin metal pads are applied by electroplating in step WS4. These pads can be made of metals such as Cu, Sn, Au, or Al, so long as the thin metal pad provides sufficient electrical contact during probing. Sn is the preferred metal for pads that will be used for testing and removed in a subsequent step discussed below, and Cu is the preferred metal for pads that will be bonded. The thickness of the thin metal pad can range from 1 micron to 100 microns with a thickness of 10 microns to 50 microns being preferred.

The small thickness of the metal pad is an important aspect of the present invention. Under prior art, 100 micron controlled collapse chip connections (C4s) are too thick to allow for chip placement, alignment and bonding by a pressure joining process. Pressure joining processes tend to crush or compress C4s, resulting in shorting of C4 interconnects. However, maintaining a thin metal pad thickness of around 10 microns allows for the use of pressure joining processes during subsequent placing and bonding steps. Photoresist is stripped from the device wafers in step WS5, and blanket metals are etched between capture pads in step WS6.

Figure 2:
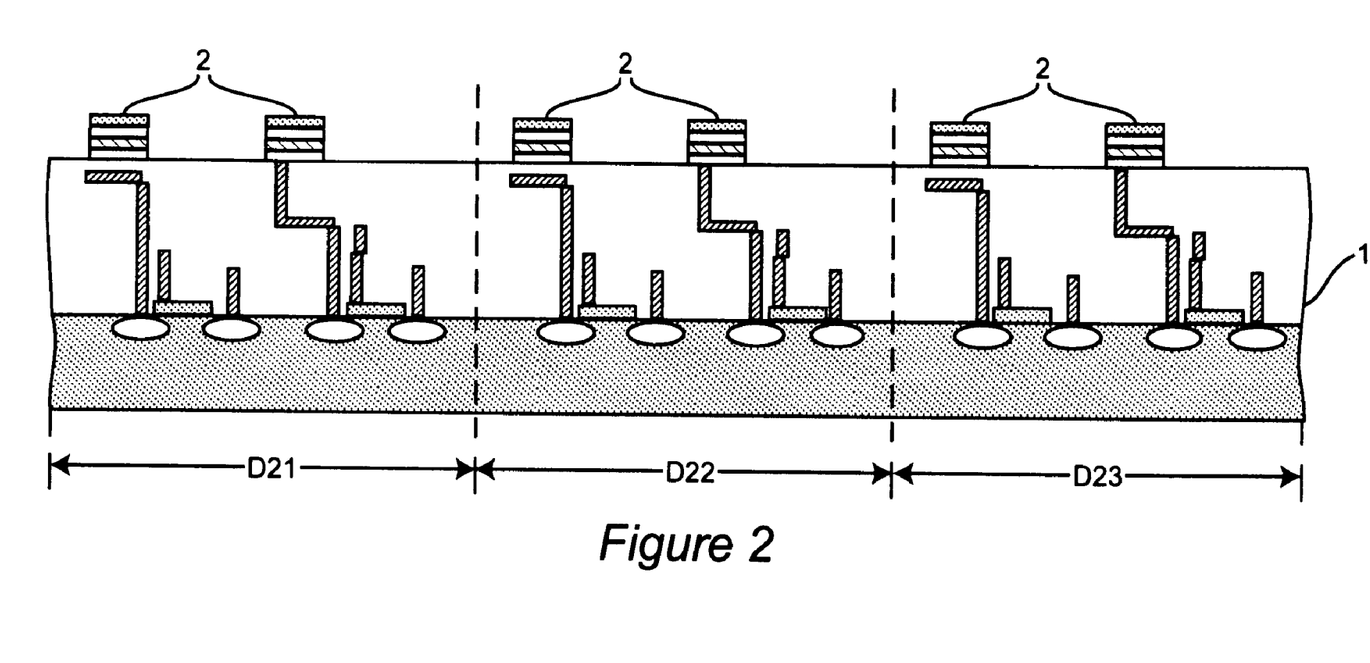
FIG. 2 is a cross-sectional drawing of a segment of a device wafer having a plurality of final capture pads.

FIG. 2 shows a cross sectional view of a segment of device wafer 1 with a plurality of final capture pads 2 that is representative of a device wafer produced after step WS6 in FIG. 1. This particular exemplary device wafer shows three nondiced individual chips D21, D22, and D23, preferably of common design and fabrication on device wafer 1, wherein each chip D21, D22, and D23 has internal elements and interconnections terminating in (for clarity of illustration) two exemplary capture pads 2 formed above them on the wafer surface. FIG. 2 is not to scale, particularly in regard to wafer thickness.

Figure 3:
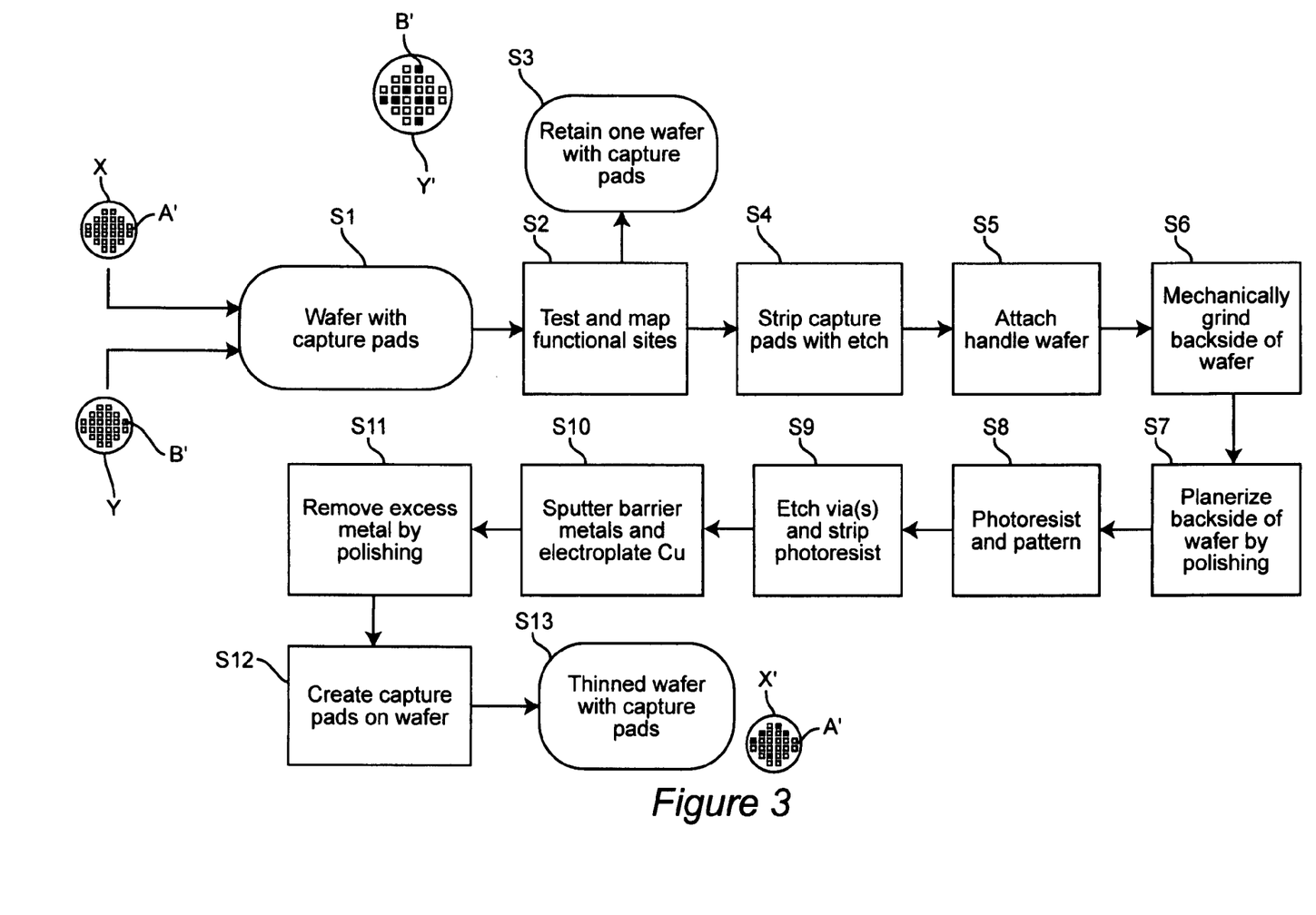
FIG. 3 is a process flow diagram showing one portion of the fabrication process of the present invention.

FIG. 3 shows the next portion of the fabrication process, in which at least one device wafer X is prepared for handling, etching vias, and thinning. First, the device wafers X and Y housing chips of designs A' and B', respectively, with capture pads are tested for functional chip sites, and functional sites are mapped for both wafers in step S2. The map of functional chip sites is retained until a later step in which known good chips from the first wafer are placed and bonded to known good sites on the second wafer. Wafers not undergoing either the via etching process or wafer thinning process (for example, wafer Y including chips of design B') are removed from the process and retained in step S3. An etching process is used to strip the capture pads on all remaining device wafers (for example, wafer Y housing chip B') in step S4. In step S5, a handle wafer is attached to the same side of the wafer that the capture pads were located. If the device wafer is to be thinned, then mechanical grinding, etching, polishing, and the like are used to reduce the side opposite to the handling wafer to approximately 50 microns in step S6. The thinned side is then planarized by polishing, preferably by chemical and mechanical polishing (CMP), in step S7. The handle wafer is critical to the stability of the wafer after the thinning process, since wafers having a thickness near 50 microns do not have sufficient structural integrity to reliably survive further processing. A thinned chip is flexible, will easily conform during bonding as needed, and has reduced internal stress.

Before etching vias, photoresist is applied and patterned as illustrated in step S8. Vias are then etched and the photoresist is stripped in step S9. Vias are filled by sputtering barrier metals, if desired, and a seed metal, followed by electroplating a metal in step S10. Typical barrier metals are Ta/TaN, and the common and preferred seeding and electroplating metal is Cu. Thinning the device wafer reduces the aspect ratio of all vias, therefore decreasing the difficulties in both etching and filling vias. Excess metal is then polished off the device wafer by either or both chemical methods or mechanical methods in step S11. The procedure for forming capture pads on a device wafer described in FIG. 1 is now repeated to form capture pads on the thinned side of the device wafer, opposite to the side attached to the handle wafer in step S12. At this stage of the 3-D integration process, the thinned wafer has etched and filled vias and capture pads (on the wafer surface opposite the location of capture pads removed earlier) as indicated in step S13.

Figure 4A:
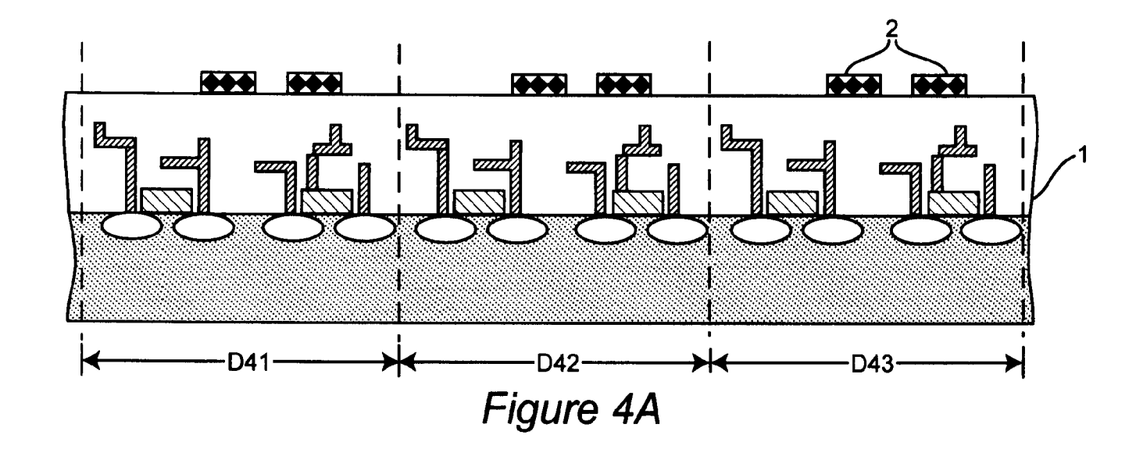
FIGS. 4a., 4b, and 4c are drawings of the same segment of a device wafer at different stages of the 3-D integration process.
Figure 4B:
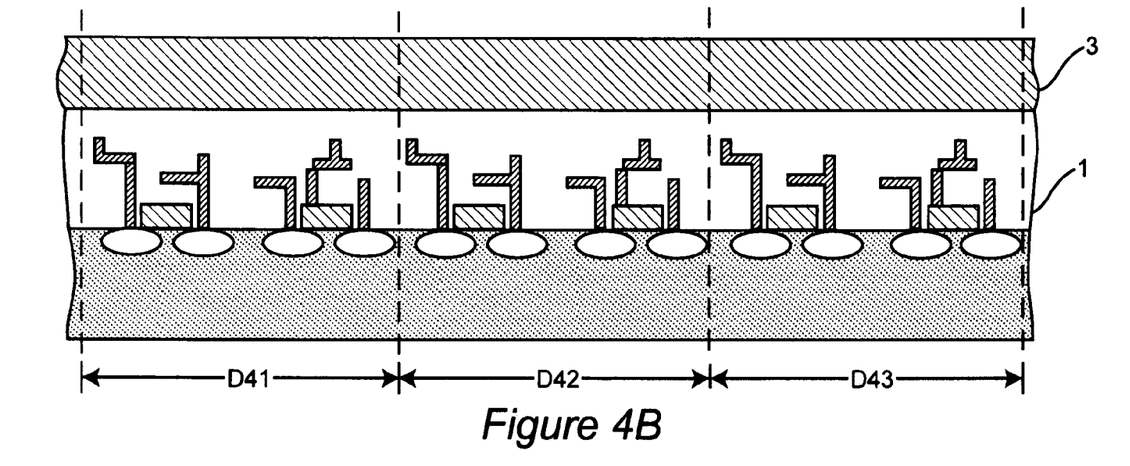
Figure 4C:
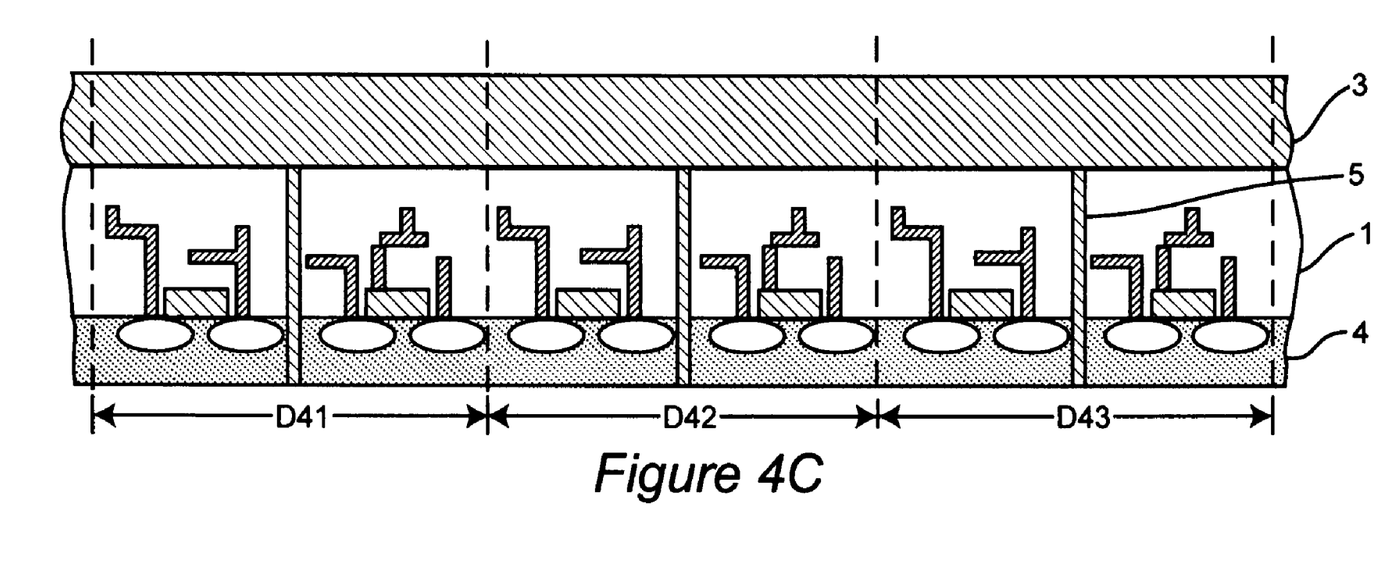

FIGS. 4a, 4b, and 4c show the same segment of a device wafer at different stages of the 3-D integration process, up to step S11 in FIG. 3. FIG. 4a shows a segment of a device wafer 1 contains a plurality of chips D41, D42, and D43. A plurality of capture pads 2 formed on each chip D41, D42, and D43 by the method described above and shown in FIG. 1 and at the beginning of the process illustrated in FIG. 3. The thickness of the capture pads is approximately 10 microns, which is thin enough to allow a pressure joining process during subsequent aligning and bonding steps or to support probing for purposes of testing without crushing of contact structures, as discussed below. At this point, the capture pad structures of wafers of different designs to be joined together may be and preferably are substantially the same although they may be formed of different materials depending on whether or not they will be removed after testing. FIG. 4b shows the same segment of a device wafer following the steps of testing and mapping (S2), stripping of capture pads 2 (S4) and attachment of handle wafer 3 (S5) discussed above and shown in FIG. 3. The capture pads 2 have preferably been removed from the full-sized device wafer 1 by an etching process, and a handle wafer 3 has been attached. The handle wafer 3 allows for convenient handling of the device wafer 1, especially after thinning, since a thinned wafer does not have sufficient structural integrity to reliably survive further processing. FIG. 4c shows the same segment of the device wafer 1 after step S11 as shown in FIG. 3. The device wafer 1 has been thinned to approximately 50 microns by mechanical grinding, etching polishing or the like or a combination thereof on the side 4 opposite from the handle wafer 3, and vias 5 are etched and filled and excess surface metal removed. The thickness of the thinned device wafer 1 can range from 1 micron to 100 microns. Again, neither the wafer thickness before thinning nor the relative amount of thinning illustrated relative to FIG. 4a is to scale.

Figure 5:
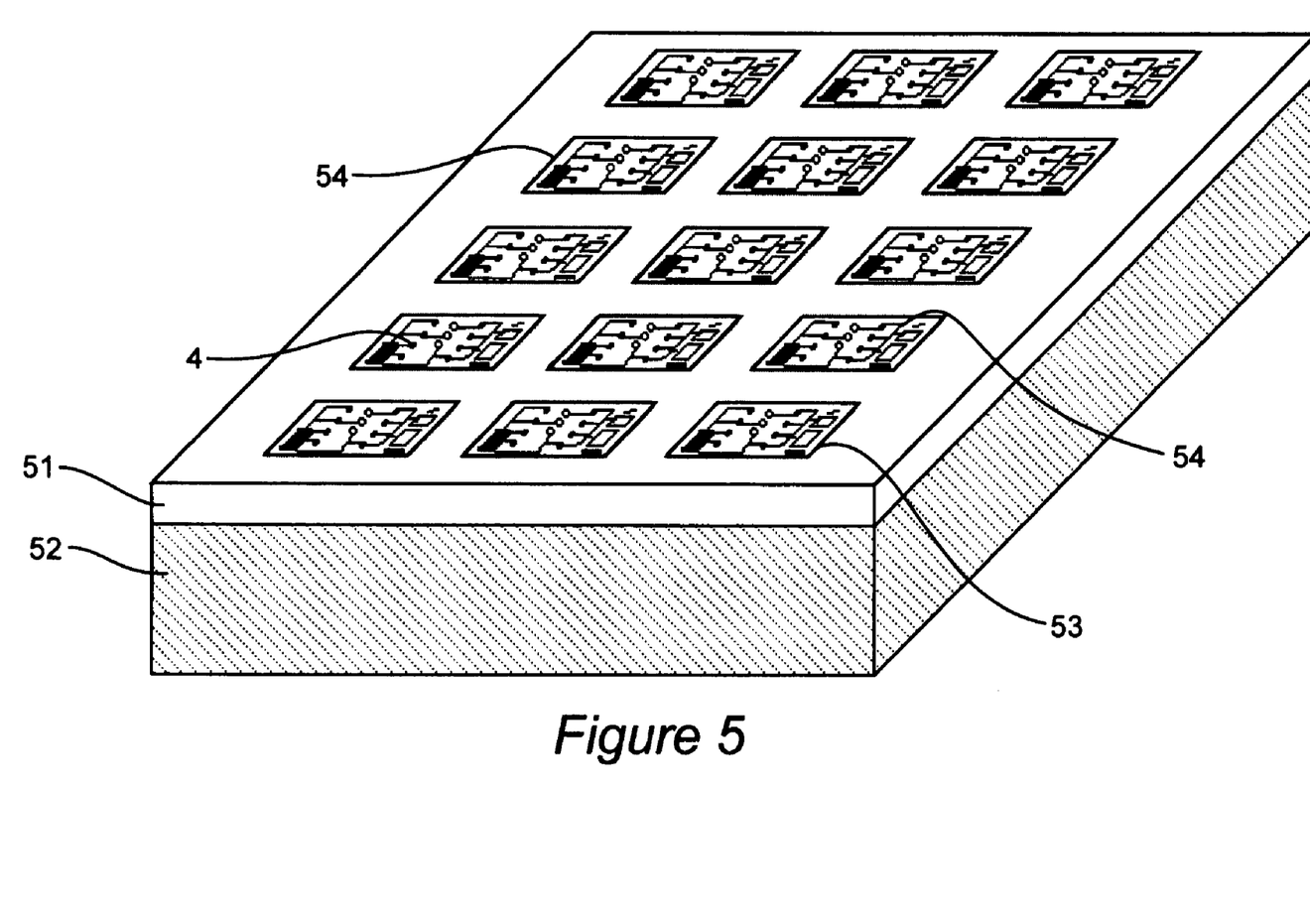
FIG. 5 is a drawing of a segment of a device wafer attached to a handle wafer.

FIG. 5 shows a sample region of a device wafer produced after step S13 of FIG. 3. The thinned device wafer 51 is attached to handle wafer 52, and includes a plurality of chips 53 designed to be complementary with a chip on a separate wafer. Each chip 53 contains a plurality of contact pads and possibly surface interconnect wiring 54, which, for example, are shown in a parallel arrangement in this particular chip 53. This figure is not to scale, as in practice, the thinned device wafer is approximately 50 microns thick, while the handle wafer is approximately 2 mm thick. As previously discussed, thinning the device wafer decreases the aspect ratio of vias, reducing the difficulty of filling the vias with a seed metal and subsequently deposited metal to provide vertical connection between metal interconnect structures.

Figure 6:
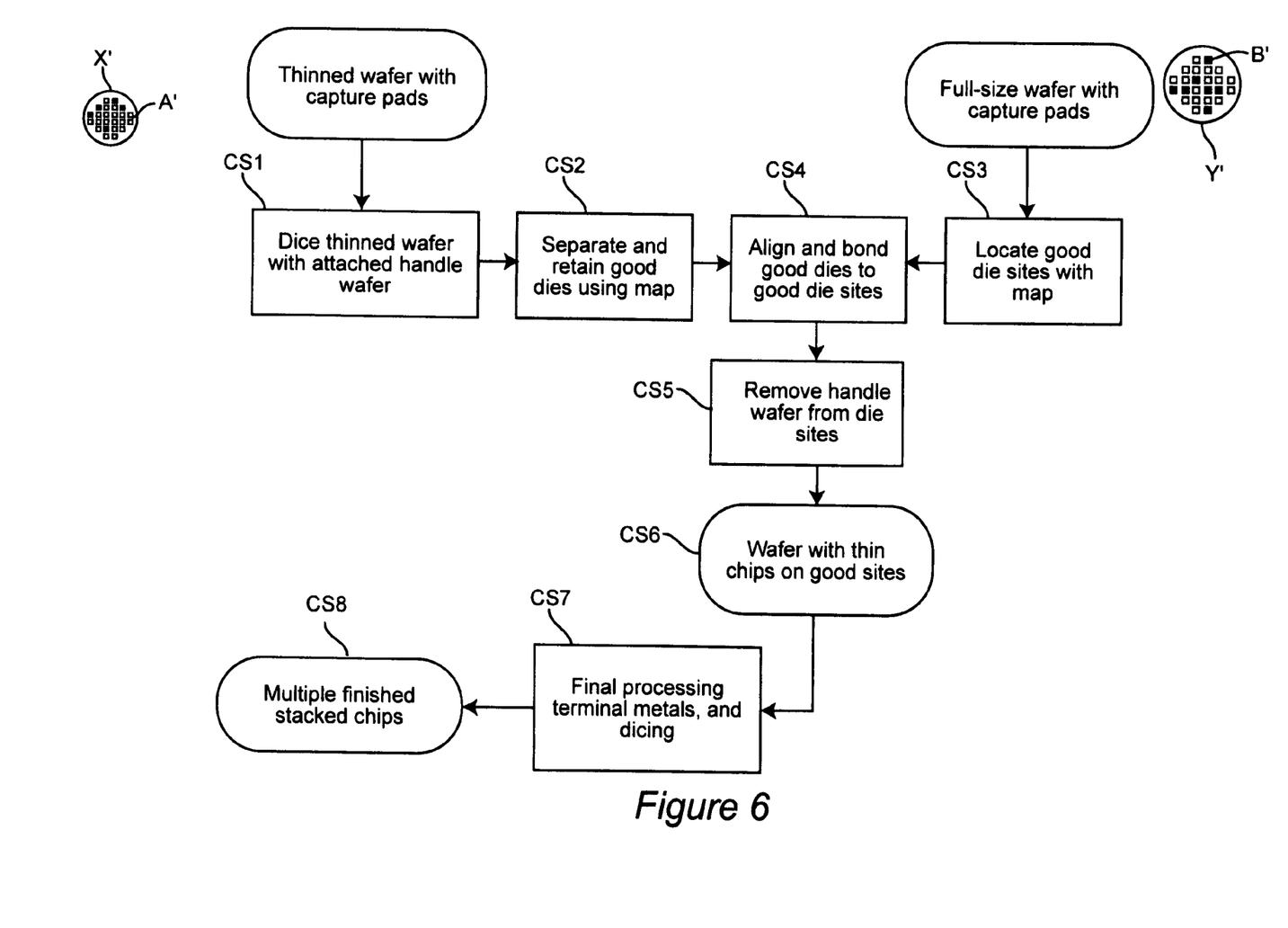
FIG. 6 is a process flow diagram showing one portion of the fabrication process of the present invention.

FIG. 6 illustrates the next stage of the 3-D integration process, in which good chips are aligned and bonded to good die sites on device wafers to form a 3-D structure while optimizing manufacturing yield. Specifically, thinned wafer X', for example, with etched vias, and the attached handle wafer, is diced into chips, or individual dies in step CS1. Good dies are retained based on the map generated during testing (S2, FIG. 3), and any faulty dies are discarded or recycled following step CS2. The map previously generated is also used to select and retain good die sites on any wafers not thinned or etched with vias, such as wafer Y' including chip design B shown in the drawing in step CS3. Good dies of design A from wafer X' are aligned with good die sites of design B on wafer Y', and bonded in step CS4. The dies can be bonded by either heating to approximately 400° C., a pressure joining process, or a combination of the two methods. Once the thinned chips have been positioned and bonded, the handling wafer is removed from each chip site in step CS5.

It is important to note that leaving the thinned wafer attached to the handle wafer during dicing of the wafer into chips and until after the step of positioning and bonding to the device wafer is an important feature of the present invention. As thinned chips do not have sufficient structural integrity to reliably survive further processing, use of the handle wafer to support thinned chips is critical to the processing of the thinned chips. Prior processing for thinning of chips or otherwise using a handle wafer retained the handle wafer intact (e.g. not diced) through the bonding process to another wafer before the handle wafer was removed and the bonded wafers then diced. However, such a procedure did not allow chips to be individually positioned after testing and mapping of good chips and good chip sites. The process in accordance with the invention provides for dicing of the handle wafer and the positioning of known good (and possibly thinned) chips only to known good chip sites on another wafer. Thus the fabrication process at this point produces a wafer with thinned chips bonded to good die sites in step CS6.

Figure 7:
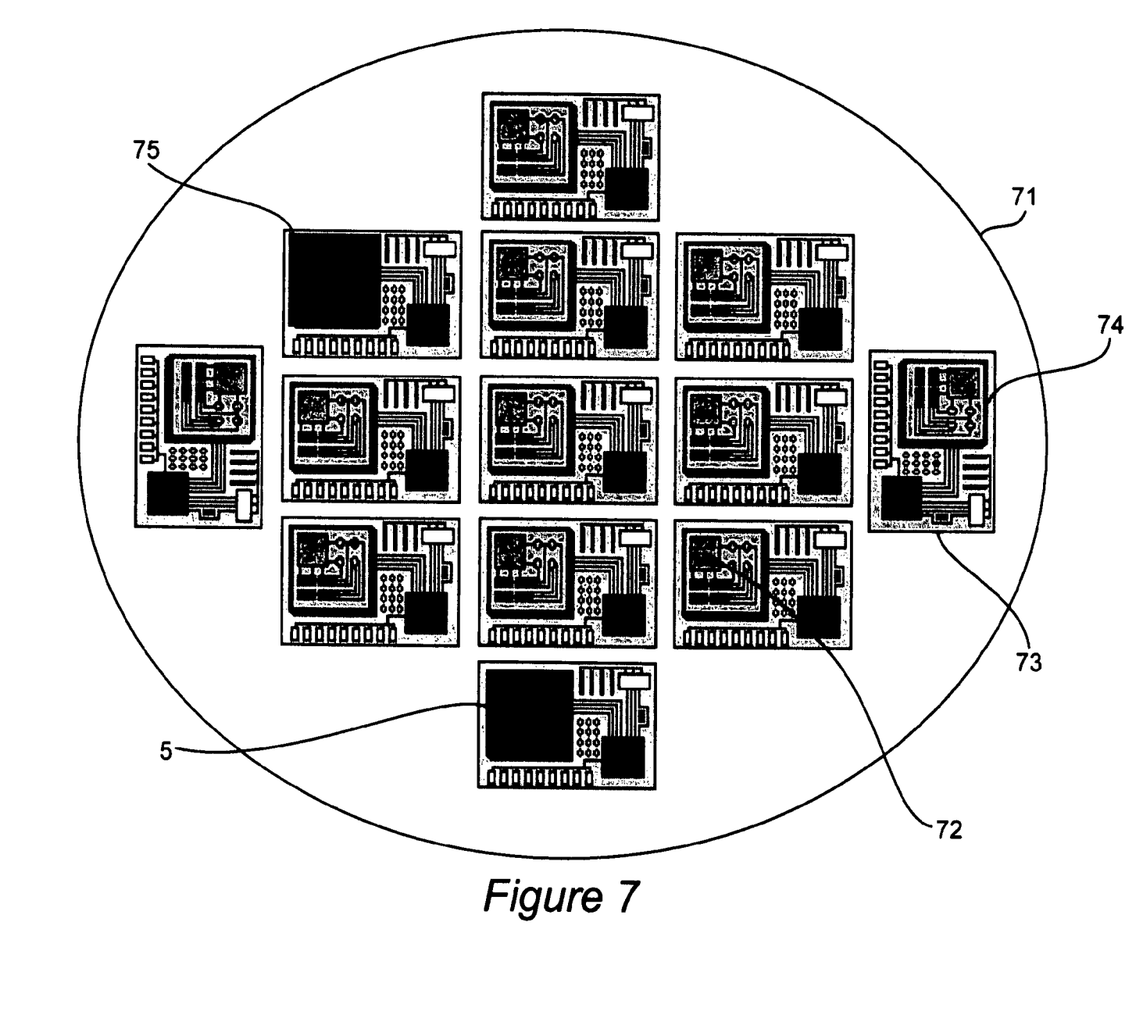
FIG. 7 is a drawing of a final device wafer having thinned chips bonded to good die sites.

FIG. 7 shows an example of a finished device wafer of the present method of 3-D chip integration. The device wafer 71 includes both good thinned chips 72 bonded to good die sites 73 on the device wafer 71, which represent a 3-D integrated chip stack 74, and also bad die sites 75 of known location so as to avoid bonding good chips to bad sites. That is, in accordance with the invention, no good thinned chips are bonded to bad die sites 75, thereby increasing the overall yield of functional 3-D chip stacks.

Figure 8:
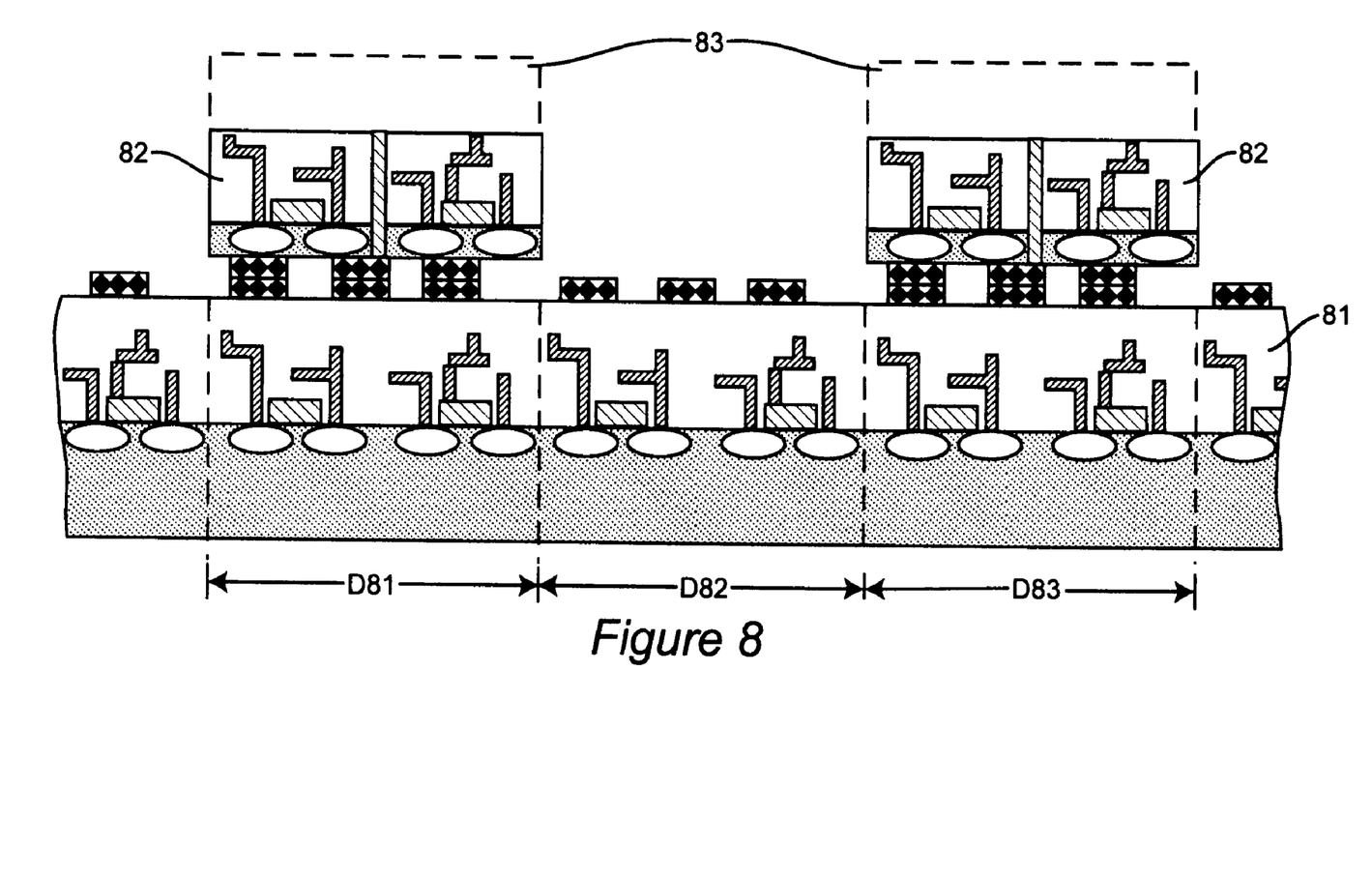
FIG. 8 is a cross-sectional drawing of a segment of a device wafer having thinned chips bonded to good die sites.

FIG. 8 is a cross-sectional view of a segment of finished device wafer 81 of the present method of 3-D chip integration. The segment of finished device wafer 81 contains a plurality of chips D81, D82, and D83. Chips D81 and D83 represent good thinned chips 82 bonded to good die sites, and chip D82 represents a bad die site to which no chip is bonded. The handle wafer was removed from the side 83 of the good thinned chips 82 following positioning and bonding, pursuant to the invention. The finished device wafer 81 is thus sufficient for final processing and dicing. It should be noted that FIG. 8 is not to scale, particularly in regard to wafer thickness.

The process continues as shown in FIG. 6, with the final processing and dicing of the wafer with thinned chips bonded to good die sites in step CS7. After the wafer is diced, the product is a plurality of functional 3-D integrated chip stacks in step CS8.

In view of the foregoing, it is seen that the present invention provides a new and improved three-dimensional chip integration process that maximizes the frequency of good-die-to-good-die bonding. By not removing the handle wafer from thinned chips until after the thinned chips are positioned and bonded to the device wafer, the reduced structural integrity of the thinned chips caused by thinning does not become a concern during alignment and bonding processing while allowing known good chips to be attached only to known good die sites and avoiding reduction of yield which would occur if either the chip or the die site is not functional. This is an improvement over prior art, since thinning chips reduces the aspect ratio of vias etched into the chips, which in turn eliminates the difficulties experienced during filling vias with a seed metal and subsequently deposited metal which also significantly increases yield. Testing and mapping the wafers before positioning and bonding improves the frequency of good-die-to-good-die bonding and thus effectively limits compromise of yield during chip stacking to imperfect bonding which is also reduced in frequency by provision of bonding pads of limited thickness and thus of improved resistance to crushing or metal reflow at high process or operational temperatures. Also, keeping the handle wafer attached to the thinned chips until after positioning and bonding increases the likelihood that further processing after the testing and mapping of functional sites will not cause good dies to malfunction, thereby maximizing the frequency of good-die-to-good-die bonding in a three-dimensional integrated chip.

While the invention has been described in terms of its preferred embodiments, those skilled in the art will recognize that the invention can be practiced with modification within the spirit and scope of the appended claims.

What is claimed is:

1. A method of 3-D integration of semiconductor integrated circuit chips comprising the steps of:

testing and mapping good die sites of a first type wafer and a second type wafer;

attaching a handle wafer to said first type wafer;

processing said first type wafer from a side opposite said handle wafer;

dicing chips including handle wafer portions from said first type wafer and attached handle wafer;

positioning and bonding said chips and attached handle wafer from good die sites of said first type wafer which have been tested and are known to be good onto known good sites of said second type wafer;

removing said handle wafer portions from said chips from first type wafer; and dicing said second type wafer with said chips bonded thereto to form 3-D integrated circuit chips.

2. The method of claim 1, wherein said first type wafer is thinned after said step of attaching a handle wafer to said first type wafer.

3. The method of claim 1, wherein the first type wafer contains chips of the first type, the second type wafer contains chips of the second type which are complementary to the chips of the first type.

4. The method of claim 1, wherein said positioning and bonding step is achieved by either heating in excess of 400° C., mechanical pressure, or both.

5. The method of claim 1, wherein at least one capture pad is formed on at least one surface of either said first type wafer or said second type wafer or both.

6. The method of claim 5, wherein a capture pad is formed by:
depositing blanket metals of first type onto the wafer;
applying photoresist to wafer;
forming capture pad shape by patterning said photoresist;
depositing a final metal pad by electroplating;
stripping photoresist; and
etching said blanket metals.

7. The method of claim 5, wherein said diced chips of the first type having capture pads are bonded to the capture pads of chips of the second type before dicing the second type wafer.

8. The method of claim 7, wherein bonding is achieved by either heating in excess of 400° C., mechanical pressure, or both.

9. The method of claim 6, wherein said blanket metals are deposited by sputtering.

10. The method of claim 6, wherein said blanket metals of first type are comprised of 10% Ti and 90% W at a thickness of 1650 Å, 50% Cr and 50% Cu at a thickness of 1800 Å, or Cu at a thickness of 4300 Å.

11. The method of claim 6, wherein said final metal is selected from the group consisting of Sn and Cu.

12. The method of claim 6, wherein said blanket metals are selected from the group consisting of Cu, Cr/Cu, and TiW.

13. The method of claim 5, wherein at least one capture pad is removed following said step of testing and mapping good die sites.

14. The method of claim 13, wherein at least one capture pad is replaced following said step of attaching a handle wafer.

15. The method of claim 1, wherein at least one via is etched into at least one wafer.

16. The method of claim 15, wherein a via is filled with barrier metals and a seed metal.

17. The method of claim 16, wherein said barrier metals are Ta/TaN.

18. The method of claim 16, wherein said seed metal is Cu.

* * * * *

UNITED STATES PATENT AND TRADEMARK OFFICE
CERTIFICATE OF CORRECTION

| | | |
|---|---|---|
| PATENT NO. | : 7,737,003 B2 | Page 1 of 1 |
| APPLICATION NO. | : 11/163226 | |
| DATED | : June 15, 2010 | |
| INVENTOR(S) | : Edward M. DeMulder et al. | |

It is certified that error appears in the above-identified patent and that said Letters Patent is hereby corrected as shown below:

In the Specification

Column 1, line 4, should read,

--Notice of Government Rights
This invention was made with Government support under N66001-04-C-8032 awarded by DARPA.
The Government has certain rights in this invention.--

Signed and Sealed this
Seventeenth Day of March, 2015

Michelle K. Lee
*Director of the United States Patent and Trademark Office*